(12) United States Patent
Kittler et al.

(10) Patent No.: US 8,809,667 B2
(45) Date of Patent: Aug. 19, 2014

(54) THERMOELECTRIC SEMICONDUCTOR COMPONENT

(75) Inventors: Martin Kittler, Frankfurt (DE); Manfred Reiche, Halle (DE)

(73) Assignee: IHP GmbH—Innovations for High Performance Microelectronics, Frankfurt (DE)

( * ) Notice: Subject to any disclaimer, the term of this patent is extended or adjusted under 35 U.S.C. 154(b) by 536 days.

(21) Appl. No.: 13/138,199

(22) PCT Filed: Jan. 12, 2010

(86) PCT No.: PCT/EP2010/050302
§ 371 (c)(1),
(2), (4) Date: Oct. 3, 2011

(87) PCT Pub. No.: WO2010/084059
PCT Pub. Date: Jul. 29, 2010

(65) Prior Publication Data
US 2012/0031450 A1 Feb. 9, 2012

(30) Foreign Application Priority Data
Jan. 20, 2009 (DE) .......................... 10 2009 000 333

(51) Int. Cl.
*H01L 35/12* (2006.01)
*H01L 27/16* (2006.01)

(52) U.S. Cl.
CPC ............... *H01L 35/12* (2013.01); *H01L 27/16* (2013.01)
USPC .......................................... 136/212; 136/203

(58) Field of Classification Search
CPC ..................................................... H01L 35/32
USPC .............................................. 136/200–242
See application file for complete search history.

(56) References Cited

U.S. PATENT DOCUMENTS 3,419,767 A * 12/1968 Dahlberg ...................... 257/467
6,013,935 A * 1/2000 Shie .............................. 257/469

(Continued)

FOREIGN PATENT DOCUMENTS

DE 4306497 7/1993
DE 4426931 8/1995

(Continued)

OTHER PUBLICATIONS

German Patent Application No. 6900274; "Thermogenerator"; Apr. 1, 1969; whole document (in German language).

(Continued)

*Primary Examiner* — Jennifer Michener
*Assistant Examiner* — Christopher Danicic
(74) *Attorney, Agent, or Firm* — Ware, Fressola, Maguire & Barber LLP

(57) ABSTRACT

A thermoelectric semiconductor component, comprising an electrically insulating substrate surface and a plurality of spaced-apart, alternating p-type (4) and n-type semiconductor structural elements (5) which are disposed on said surface and which are connected to each other in series in an electrically conductive manner alternatingly at two opposite ends of the respective semiconductor structural elements by conductive structures, in such a way that a temperature difference (2ΔT) between the opposite ends produces an electrical voltage between the conductive structures or that a voltage difference between the conductive structures (7, 9; 13, 15) produces a temperature difference (2ΔT) between the opposite ends, characterized in that the semiconductor structural elements have a first boundary surface between a first and a second silicon layer, the lattice structures of which are considered ideal and are rotated by an angle of rotation relative to each other about a first axis perpendicular to the substrate surface and tilted by a tilt angle about a second axis lying parallel to the substrate surface, in such a way that a dislocation network is present in the region of the boundary surface.

11 Claims, 2 Drawing Sheets

(56) References Cited

U.S. PATENT DOCUMENTS

| | | | |
|---|---|---|---|
| 2006/0102223 A1 | 5/2006 | Chen et al. | 136/201 |
| 2008/0185030 A1 | 8/2008 | Pierce et al. | 136/203 |
| 2008/0202575 A1 | 8/2008 | Ren et al. | 136/201 |
| 2008/0230105 A1 | 9/2008 | Kanno et al. | 136/201 |
| 2009/0056345 A1* | 3/2009 | Edwards et al. | 62/3.7 |

FOREIGN PATENT DOCUMENTS

| | | |
|---|---|---|
| DE | 198020402 | 2/1999 |
| DE | 102006047071 | 12/2007 |

OTHER PUBLICATIONS

English language summary / Statement of Relevance for German Patent Application No. 6900274.

Hebling, C.; "Mikroenergietechnik macht mobil"; Angewandte Physik; 2007; Physik Journal 6 (2007), No. 10; Wiley-VCH Verlag GmbH & Co. KgaA; Weinhelm, Germany.

English language summary / Statement of Relevance for article "Mikroenergietechnik macht mobil".

Sommerlatte, J. et al.; "Thermoelektrische Multitalente"; Festkörperphysik; 2007; Physik Journal 6 (2007), No. 5; Wiley-VCH Verlag GmbH & Co. KgaA; Weinhelm, Germany.

English language summary / Statement of Relevance for article "Thermoelektrische Multitalente".

English abstract for DE 102006047071.

English abstract for DE 4306497.

English abstract for DE 4426931.

English abstract for DE 19802402.

Yu, X. et al.; "Properties of dislocation networks formed by Si wafer direct bonding"; Materials Science in Semiconductor Processing; 2006; pp. 96-101; vol. 9; Elsevier Ltd.

Boukai, A. et al.; "Silicon nanowires as efficient thermoelectric materials"; Nature; Jan. 10, 2008; pp. 168-171; vol. 451; Nature Publishing Group.

Hochbaum, A. et al.; "Enhanced thermoelectric performance of rough silicon nanowires"; Nature; Jan. 10, 2008; pp. 168-171; vol. 451; Nature Publishing Group.

Kittler, M. et al; "Dislocations as Active Components in Novel Silicon Devices"; Advanced Engineering Materials; 2009; pp. 249-258; vol. 11, No. 4; Small Wiley-VCH Verlag GmbH & Co. KGaA; Germany.

Kittler, M. et al.; "Regular Dislocation Networks in Silicon as a Tool for Nanostructure Devices used in Optics, Biology, and Electronics"; Concepts; 2007; pp. 964-973; vol. 3, No. 6; Small Wiley-VCH Verlag GmbH & Co. KgaA; Germany.

Fulkerson, W. et al.; "Thermal Conductivity, Electrical Resistivity, and Seebeck Coefficient of Silicon from 100 to 1300° K"; Physical Review; Mar. 15, 1968; pp. 765-782; vol. 167, No. 3; American Physical Society.

Ishikawa, Y. et al; "Conductivity Enhancement in Thin Silicon-on-Insulator Layer Embedding Artificial Dislocation Network"; Mater. Res. Soc. Symp. Proc.; 2005; pp. 253-258; vol. 864; Materials Research Society.

Kittler, M. et al.; "Dislocations in Silicon as a Tool to be used in Optics, Electronics and Biology"; doi:10.4028/www.scientific.net/SSP.131-133.289; 2008; whole document; Trans Tech Publications; Switzerland.

Van Herwaarden, A.W.; "The Seebeck Effect in Silicon Ics"; Sensors and Actuators; 1984; pp. 245-254; vol. 6; Elsevier Sequoia; Netherlands.

* cited by examiner

THERMOELECTRIC SEMICONDUCTOR COMPONENT

CROSS REFERENCE TO RELATED APPLICATIONS

This application is the U.S. National Stage of International Application No. PCT/EP2010/050302 filed on Jan. 12, 2010 which was published in German on Jul. 29, 2010 under International Publication Number WO 2010/084059, which International Application in turn claims the benefit of German Application No. DE 10 2009 000 333.9 filed Jan. 10, 2009.

BACKGROUND OF THE INVENTION

1. Technical Field

The invention relates to a thermoelectric semiconductor component and to an electronic component containing such a thermoelectric semiconductor component.

2. Discussion of Related Art

Thermoelectric converters and thermoelectric generators are used in many fields of technology, the primarily aim being to utilize heat generated by technically necessary processes. The use of thermoelectric generators is even possible in the production of semiconductor components. The heat that is to be converted into electric energy may result from any number of different factors. The operating energy of integrated circuits, for example, leads to the entire circuit being heated and in the case of conventional microchips can well reach the 70-80° C. range.

This heating is generally undesired, so special precautions need to be taken in the components in order to prevent thermal damage to specific electronic elements. The heat may be dissipated in a conventional manner, or specific layers, series of layers, or materials may be designed and deployed beforehand, in the circuit design stage, in such a way, with regard to their thermal conductivity, that sufficient dissipation of any heat produced during operation is ensured. In devices such as mobile telephones, utilizing the significant amounts of heat produced by the high-frequency components used therein could extend the duration of use within a single battery charging cycle. If any temperature differences arise, a thermoelectric generator may even replace the conventional battery in low-consumption devices.

Such converters may also be used for cooling. Conventional cooling devices can be supported in this way. Converters designed as Peltier coolers are particularly advantageous, however, where conventional methods of dissipating operating heat cannot be applied due to miniaturization of components.

The suitability of semiconductor materials for use in thermoelectric semiconductor components such as Seebeck or Peltier elements is generally described by a dimensionless figure of merit ZT, which is proportional to the square of the Seebeck coefficient S and to the temperature, and inversely proportional to the specific electrical resistance $\rho$ and the thermal conductivity $\kappa$. The figure of merit ZT is defined as follows:

$$ZT = S^2 \cdot T / \rho \cdot \kappa$$

Thermoelectric materials that are widely used commercially, such as bismuth telluride ($Bi_2Te_3$), have a figure of merit ZT of approximately 1, whereas silicon, as a bulk material, has a figure of merit ZT of approximately 0.01. The latter is due to the silicon having a high thermal conductivity, which counters the formation of a temperature gradient in a piece of silicon material.

It has recently been shown that when silicon nanowires (silicon materials with structure sizes in the nanometer range) are used, ZT values of 0.6 or even 0.4 are possible at room temperature; A. I. Boukai et al. "Si-Nanowires as efficient thermoelectric materials", Nature 451, 168 (2008); A. I. Hochbaum et al. "Enhanced thermoelectric performance of rough Si nanowires", Nature Vol. 451, 163 (2008). Boukai et al. used rectangular wires with structure sizes in the 10-20 nm range, and Hochbaum et al. used wires with sizes in the 20-300 nm range that had rough surfaces and circular cross-sections. The observed increase of almost two orders of magnitude in the ZT value for silicon, i.e., from $10^{-2}$ to values of approximately 1, is mainly attributed to a strong reduction in thermal conductivity inside the silicon nanowires. This effect, known as "phonon drag" is dependent of the size and shape of the nanowires and on obstacles which limit heat flow, such as surface roughness of the wires.

It would be desirable to translate these findings into technologically useful devices.

Hence, the technical problem addressed by the present invention is that of providing a thermoelectric semiconductor component which has improved properties compared to thermoelectric semiconductor components whose manner of operation is based on the properties of bulk semiconductor material.

DISCLOSURE OF INVENTION

This problem is solved by a thermoelectric semiconductor component, comprising an electrically insulating substrate surface and a plurality of spaced-apart, alternating p-type and n-type semiconductor structural elements which are disposed on said surface and which are connected to each other in series in an electrically conductive manner alternatingly at two opposite ends of the respective semiconductor structural elements by conductive structures, in such a way that a temperature difference ($2\Delta T$) between the opposite ends produces an electrical voltage between the conductive structures or that a voltage difference between the conductive structures produces a temperature difference ($2\Delta T$) between the opposite ends, characterized in that the semiconductor structural elements have a first boundary surface between a first and a second silicon layer, the lattice structures of which are considered ideal and are rotated by an angle of rotation relative to each other about a first axis perpendicular to the substrate surface and tilted by a tilt angle about a second axis lying parallel to the substrate surface, in such a way that a dislocation network is present in the region of the boundary surface.

The thermoelectric semiconductor component of the present invention derives from the realization that the improvement of ZT values in nanostructures, which became known in the prior art, can be realized especially well, for thermoelectric conversion in semiconductor components usable in large-scale technological systems, by means of a dislocation network. It has been found that a dislocation network, like the one provided in the thermoelectric semiconductor component according to the invention, can be systematically produced with the desired characteristics on the basis of differently adjustable angles of rotation and angles of tilt, and that it can be reproduced particularly well. This is of major importance for the industrial production of thermoelectric semiconductor components.

A dislocation network, such as the one in the thermoelectric semiconductor component according to the invention, shows similar and in some cases even significantly improved characteristics compared to the nanowires used by Boukai et al. For example, in a semiconductor structural element such as the one provided in the thermoelectric semiconductor component according to the invention, the specific electrical resistance ρ can be reduced by about four orders of magnitude compared to a similar semiconductor structural element made of bulk material.

In this way, the figure of merit ZT is significantly increased, which significantly improves the thermoelectric properties of the thermoelectric semiconductor components of the present invention compared to conventional components based on bulk semiconductor material.

The thermoelectric semiconductor component of the present invention and its various embodiments as described in the following are particularly suitable for use in electronic semiconductor components that additionally contain at least one integrated circuit. The thermoelectric semiconductor component may be used as a thermoelectric generator or also as a heat pump. By integrating the thermoelectric semiconductor component monolithically with heat-generating electronic circuits on one chip, the heat produced can be converted into useful electric energy with significantly improved efficiency.

The thermoelectric semiconductor component according to the present invention also has the advantage that the energy recovered by the thermoelectric generator can be used to charge accumulator cells in the component, or connected to the component.

Some embodiments of the various thermoelectric semiconductor component according to the present invention shall now be described. Unless they are described as alternatives to each other, the additional features of the respective embodiments may be combined with each other to form new embodiments.

In the thermoelectric semiconductor component, the second axis defining the tilt of the first and second silicon layers relative to each other is preferably oriented parallel or approximately parallel to a <110> direction of the silicon crystal lattice of the silicon layers. The arrangement of the dislocation network relative to the surface of the semiconductor structural elements depends, firstly, on the thickness of the semiconductor structural elements, i.e., on their extension perpendicular to the substrate surface. Secondly, the ease with which the production process for the dislocation network can be handled plays an essential role for the arrangement of the dislocation network. In advantageous embodiments, the dislocation network is disposed at a depth of between 20 nm and 1000 nm below a surface of the semiconductor structural elements which faces away from the substrate surface. The smaller the thickness of the semiconductor structural elements, the greater the influence of the dislocation network on their specific electrical resistance. For that reason, a thickness in the range of forty to some hundreds of nanometers is preferred.

Another advantage of the thermoelectric component of the present invention is that the thermal conductivity κ can be significantly reduced, compared to that of bulk material. This was explained above with reference to "phonon drag". By decorating the dislocation network with precipitates, additional obstacles for phonon propagation are created, thus resulting in a further reduction in the thermal conductivity κ. The advantage of this embodiment is that precipitates can be produced in a controlled manner.

The geometrical parameters of the dislocation network can also be adjusted in a similarly well-controlled manner in the thermoelectric semiconductor component. To this end, it is necessary to control the angle of rotation and the angle of tilt during production of the semiconductor component. This is possible, for example, with the wafer bonding method, e.g. with the SmartCut method known from the prior art. Angles are preferably set that allow a dislocation network to ensue with dislocation structures spaced apart from each other at lateral distances in the range of one to fifty nanometers. It is important in this regard that the dislocation structures have dimensions and distances from each other that are significantly smaller than the structure size of the semiconductor structural elements. One embodiment has an angle of rotation of 1.3° and a tilt angle of 0.64°, for example. The first and second silicon layers are preferably formed by two silicon disks with (100) surfaces.

As far as the influence of the Seebeck coefficient S is concerned, the embedding of dislocations and dislocation networks according to the invention leads to said coefficient being increased. Due to the dimensionless figure of merit ZT being dependent on the square of the Seebeck coefficient, this leads to a clearly noticeable increase in that dimensionless variable, which is a measure for the efficiency of the thermoelectric generator.

With current production technologies, the angle of rotation and the tilt angle can be produced and determined with an accuracy of at least 0.1°.

However, it is also conceivable to use silicon disks with surface orientations other than (100), for example silicon disks with (111) or (010) orientations. Other combinations of angles are specified further below in conjunction with the description of the Figures.

The semiconductor structural elements can be produced with known lithographic technologies with a high area-based number density. In a series circuit, this permits a voltage of some volts to be generated from a temperature difference of only 10° K. An area-based number density of at least 500 semiconductor structural elements per square millimeter is therefore preferred. A value of 1000 mm$^{-2}$ or more is particularly preferred.

In preferred embodiments, the semiconductor structural elements on the insulating substrate surface have cubic, rod-shaped or cylindrical shapes. Rod-shaped semiconductor structural elements can be lithographically produced in a particularly reliable manner.

A thermoelectric semiconductor element may be designed, as a converter component according to the invention for converting thermal energy into electrical energy, in such a way that an electromotive force is induced by a temperature difference formed between the junctions of n-type and p-type semiconductor elements, and can be obtained as a voltage at contacts of the series circuit. Such a thermoelectric converter component then has the function of a Seebeck element and, by converting that heat into electric energy, extracts from electronic components the heat that arises in them and adversely affects them.

However, the thermoelectric semiconductor component according to the invention may also be configured to convert electrical energy into thermal energy in such a way that a voltage difference across contacts in the series circuit results in a temperature difference at junctions of the n-type and p-type semiconductor components. Such a Peltier element can be used to cool electronic components ("Peltier coolers"). Of course, it is also conceivable to use such a Peltier element as a heat pump.

In one embodiment of the thermoelectric semiconductor component according to the invention, the semiconductor structural elements form thin semiconductor layers with layer thicknesses in the nanometer range, or structured rods (nanorods) and wires (nanowires) in the nanometer range. These can be produced with customary structuring technology.

It is particularly preferred that the thermoelectric semiconductor component according to the invention can be monolithically integrated in silicon technology. An electronic component according to the invention therefore contains a thermoelectric semiconductor component which is monolithically integrated with at least one electronic circuit on a single substrate in accordance with an embodiment described herein.

In the case of an electronic component in which the thermoelectric semiconductor component is monolithically integrated, the semiconductor structural elements are preferably disposed on the insulating substrate layer of an SOI (Silicon-on-Insulator) substrate. The advantage here is that it is easy to add or connect to the wide variety of components of all kinds that can currently be made in customary silicon technology.

Alternatively or additionally, an electronic component may contain the thermoelectric semiconductor component on a first chip and at least one electronic circuit on a second chip, which is thermally or electrically coupled to the thermoelectric semiconductor component. Such arrangements, in the form of "systems-in-a-package", offer the possibility of ensuring improved control of temperature, even in three-dimensional chip arrangements.

Other advantageous configurations of the invention are found in the dependent claims.

BRIEF DESCRIPTION OF THE DRAWINGS

The invention shall now be described in greater detail with reference to an embodiment and the accompanying drawings, in which.

DETAILED DESCRIPTION

Figure 1:
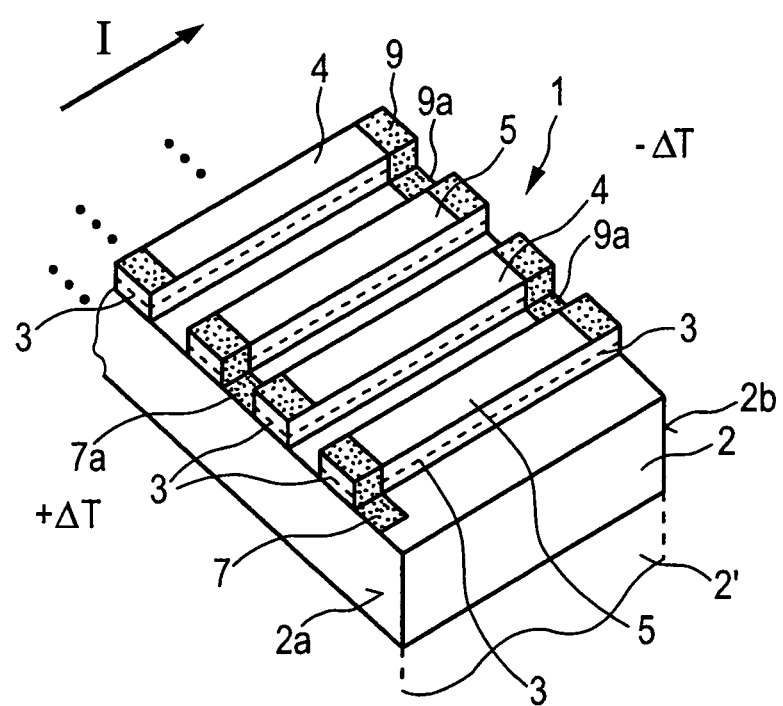
FIG. 1 shows a simplified topology of a silicon component according to the invention and FIG. 2 shows a thermoelectric converter realized on a chip.

FIG. 1 shows a monolithically integrated thermoelectric component that was basically produced with the aid of silicon wafer bonding. This was done by bonding a top silicon wafer 1 onto an $SiO_2$ section of a bottom wafer 2. Deliberate misfits in the orientations of a bottom oxide-coated wafer 2, which is only suggested in the drawing, in relation to a bonded wafer 1 applied onto the former has led to very strong dislocation networks being formed, which are marked schematically by broken lines 3.

As shown in FIG. 1, wafer 1 has been structured by process steps known in semiconductor technology and common in lithography, which are typically ion bombardment, etching processes, coating techniques and photomasking. Semiconductor components 4, 5 and the trenches inserted between them have very short dimensions in the nanometer range.

A thermoelectric converter or generator is formed by a series of p-type semiconductor elements 4, produced by implanting acceptor-type doping substances, and n-doped semiconductor elements 5, obtained by implanting donor-type doping substances, in conjunction with the respective trenches which lie therebetween and which expose the surface of the $SiO_2$ section. At a first end face 2a of the $SiO_2$ section, the rod-like p- and n-type semiconductor elements 4, 5 are provided with contact strips 7. P- and n-type rods 4, 5 are provided with further contact elements 9 at a second side 2b opposite the first side 2a of the $SiO_2$ section 2.

If a component which generates heat when an electric voltage is supplied and a current of electricity flows, not shown in the highly simplified FIG. 1, is present on side 2a, an electric voltage corresponding to the supplied heat $+\Delta T$ will be available between contact elements 7, 9 of the thermoelectric generator. This electric voltage may be supplied via respective conductor arrangements, not shown, to other loads or storage units, such as accumulators. The two-dimensionally arranged n-type and p-type semiconductor elements are connected alternately in series, with one n-type and one p-type rod 4, 5 being connected alternately on sides 2a and 2b to contact bridges 7a and 9a, respectively. Using an n-type and a p-type semiconductor material as a thermocouple results in optimal exploitation of the temperature gradient $2\Delta T$ responsible for producing the thermoelectric voltage, due to the opposite polarity of their absolute, differential thermoelectric voltages.

Figure 2:
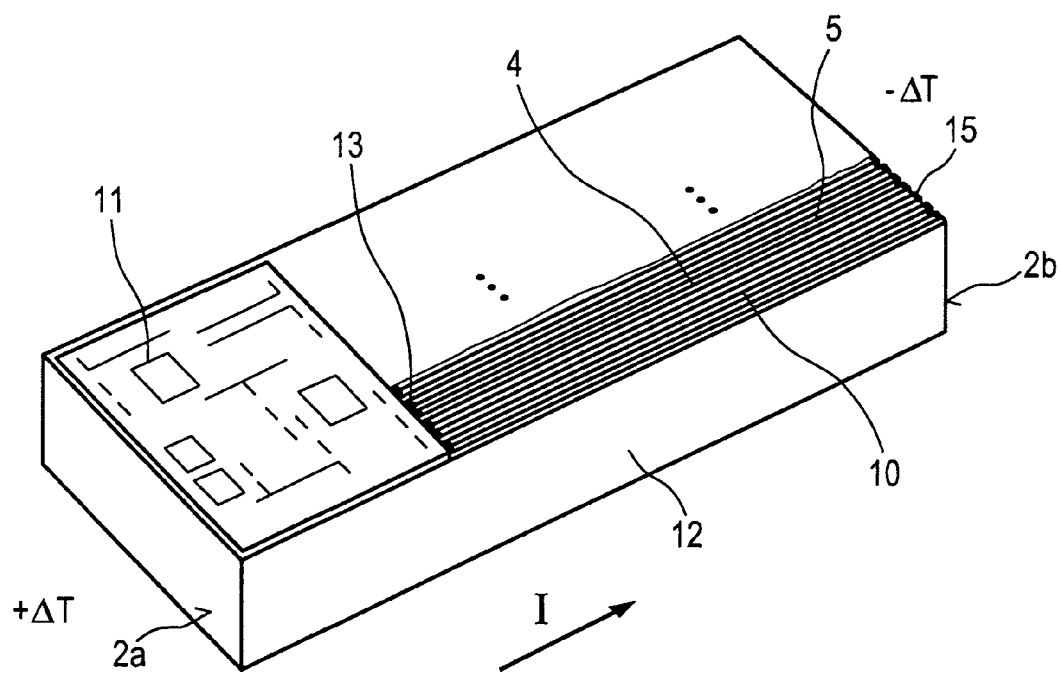

In FIG. 2, a thermoelectric converter 10 is monolithically integrated with an integrated circuit 11 on a semiconductor wafer 12. In the connected operation mode, region 11 generates thermal energy due to the miniaturized switching and storage units mounted in standard semiconductor technology. This is symbolized here in highly simplified manner by the temperature gradients, shown by arrow T, between the two sides 2a, 2b which differ by a temperature $2\Delta T$. As a result, a gradient of up to $2\Delta T=70°$ C. is present between a first side 12a and a second side 12b of the silicon wafer. The thermoelectric generator, which may be configured like the thermoelectric generator shown in simplified form in FIG. 1, for example, and which is connected to integrated circuit 11, converts the heat ($k_B \cdot 2\Delta T$) supplied to it from integrated circuit 11 into a thermoelectrical voltage which can be tapped between contact elements 13 and 15. With a prevailing temperature difference of $2\Delta T=10$ K, this voltage may well amount to a number of volts when a large number of semiconductor elements 4, 5 are integrated with a density greater than 1000 $mm^{-2}$. The thermoelectric generator 10 has dislocation networks which cannot be shown in FIG. 2 and which are embedded in rod-like semiconductor elements 4, 5, the latter being structured in the nanometer range. Inserting the dislocation networks into nanorods 4, 5 of thermoelectric generator 10 causes an increase in the dimensionless figure of merit ZT, which is dependent on temperature T and parametrically dependent on the Seebeck coefficient S, the thermal conductivity κ and the specific electrical resistance ρ as variables.

According to the invention, dislocations and/or dislocation networks are provided as preferred defects in the crystal lattice of the semiconductor structural elements. However, it is also conceivable to insert precipitates, foreign atoms or clusters of foreign atoms. When compound semiconductors are used, it is also possible to use antisite defects as crystal defects within the meaning of the invention. Crystal lattice defects may also be provided in the form of crystal boundaries resulting between areas with differing crystallographic orientation. Along these existing accumulations of impurity atoms, impurity atom decorations at dislocations or dislocation networks may also be understood as crystal defects within the meaning of the invention.

What is claimed is:

1. A thermoelectric semiconductor component, comprising
an electrically insulating substrate surface and
a plurality of spaced-apart, alternating p-type and n-type semiconductor structural elements made of crystalline silicon which are disposed on said surface and which are connected to each other in series in an electrically conductive manner alternatingly at two opposite ends of the respective semiconductor structural elements by conductive structures, in such a way that a temperature difference between the opposite ends produces an electrical voltage between the conductive structures or that a voltage difference between the conductive structures produces a temperature difference between the opposite ends, wherein the semiconductor structural elements have a first boundary surface between a first silicon layer and a second silicon layer, the lattice structures of which are rotated by a non-zero angle of rotation relative to each other about a first axis perpendicular to the substrate surface and the lattice structures of which are tilted by a non-zero tilt angle about a second axis lying parallel to the substrate surface, in such a way that a dislocation network is present in the region of the first boundary surface.

2. The thermoelectric semiconductor component according to claim 1, in which the second axis defining the tilt of the first and second silicon layers relative to each other is oriented parallel or approximately parallel to a <110> direction of the silicon crystal lattice.

3. The thermoelectric semiconductor component according to claim 1, in which the dislocation network is disposed at a depth of between 20 nm and 1000 nm below a surface of the semiconductor structural elements which faces away from the substrate surface.

4. The thermoelectric semiconductor component according to claim 1, in which the dislocation network is decorated with precipitates.

5. The thermoelectric semiconductor component according to claim 1, in which the dislocation network has dislocation structures that are mutually spaced apart by lateral distances in the range of 1 to 50 nm.

6. The thermoelectric semiconductor component according to claim 1, in which the semiconductor structural elements are provided with an area-based number density of at least 500 per square millimeter.

7. The thermoelectric semiconductor component according to claim 1, in which the semiconductor structural elements have a cubic, rod-shaped or cylindrical shape.

8. An electronic component, comprising a thermoelectric semiconductor component according to claim 1.

9. The electronic component according to claim 7, in which the thermoelectric semiconductor component is monolithically integrated with at least one electronic circuit on a single substrate.

10. The electronic component according to claim 8, in which the substrate, on the electrically insulating substrate surface of which the semiconductor structural elements are disposed, is an SOI substrate.

11. The electronic component according to claim 7, in which the thermoelectric semiconductor component is disposed on a first chip and is thermally or electrically coupled to at least one electronic circuit on a second chip.

\* \* \* \* \*

UNITED STATES PATENT AND TRADEMARK OFFICE
CERTIFICATE OF CORRECTION

PATENT NO. : 8,809,667 B2  
APPLICATION NO. : 13/138199  
DATED : August 19, 2014  
INVENTOR(S) : Kittler et al.

Page 1 of 1

It is certified that error appears in the above-identified patent and that said Letters Patent is hereby corrected as shown below:

Title Page (73) Assignee, please amend the Assignee to read --IHP GmbH – Innovations for High Performance Microelectronics / Leibniz-Institut für Innovative Mikroelektronik--.

Signed and Sealed this  
Twenty-fourth Day of March, 2015

Michelle K. Lee  
*Director of the United States Patent and Trademark Office*